(12) United States Patent
Takimoto et al.

(10) Patent No.: US 12,209,679 B2
(45) Date of Patent: Jan. 28, 2025

(54) FLUID CONTROL DEVICE, FLUID SUPPLY SYSTEM, AND FLUID SUPPLY METHOD

(71) Applicant: FUJIKIN INCORPORATED, Osaka (JP)

(72) Inventors: Masahiko Takimoto, Osaka (JP); Toshihide Yoshida, Osaka (JP); Tsutomu Shinohara, Osaka (JP); Kouji Nishino, Osaka (JP)

(73) Assignee: FUJIKIN INCORPORATED, Osaka (JP)

( * ) Notice: Subject to any disclaimer, the term of this patent is extended or adjusted under 35 U.S.C. 154(b) by 0 days.

(21) Appl. No.: 18/526,626

(22) Filed: Dec. 1, 2023

(65) Prior Publication Data

US 2024/0151319 A1 May 9, 2024

Related U.S. Application Data

(62) Division of application No. 18/003,259, filed as application No. PCT/JP2021/022624 on Jun. 15, 2021, now Pat. No. 11,873,916.

(30) Foreign Application Priority Data

Jun. 29, 2020 (JP) ................. 2020-111466

(51) Int. Cl.
*F16K 31/02* (2006.01)
*F16K 37/00* (2006.01)
(Continued)

(52) U.S. Cl.
CPC ........... *F16K 31/02* (2013.01); *G05D 7/0623* (2013.01); *G05D 7/0635* (2013.01); *F16K 37/00* (2013.01);
(Continued)

(58) Field of Classification Search
CPC ....... Y10T 137/87877; Y10T 137/2562; Y10T 137/7761; H01L 21/67017; G05D 7/0652;
(Continued)

(56) References Cited

U.S. PATENT DOCUMENTS 5,865,205 A * 2/1999 Wilmer ................ G05D 7/0635
73/1.16
7,918,238 B2 * 4/2011 Tanaka ..................... G01F 5/00
700/282
(Continued)

FOREIGN PATENT DOCUMENTS

JP 2003-120832 A 4/2003
JP 3890138 B2 3/2007
(Continued)

OTHER PUBLICATIONS

International Search Report issued in PCT/JP2021/022624; mailed Sep. 7, 2021.

*Primary Examiner* — William M McCalister
(74) *Attorney, Agent, or Firm* — Studebaker & Brackett PC

(57) ABSTRACT

A fluid control device 10 comprises a valve device V2 including actuators 22 and 24 for opening and closing a flow path and adjusting a flow rate of a fluid flowing through the flow path, a pressure sensor PT provided upstream of the valve device V2, and a control circuit 12 connected to the valve device V2 and the pressure sensor PT, and the control circuit 12 controls an operation of the actuator based on a pressure measured by the pressure sensor PT and a reference pressure drop curve, while the upstream side of the fluid control device is closed and the valve device is opened using the actuators.

10 Claims, 12 Drawing Sheets

(51) Int. Cl.
    *G05D 7/06*     (2006.01)
    *H01L 21/67*     (2006.01)

(52) U.S. Cl.
    CPC .......... *F16K 37/005* (2013.01); *G05D 7/0652* (2013.01); *H01L 21/67017* (2013.01); *Y10T 137/2562* (2015.04); *Y10T 137/7761* (2015.04); *Y10T 137/87877* (2015.04)

(58) Field of Classification Search
    CPC .... G05D 7/0623; G05D 7/0635; F16K 31/02; F16K 37/005
    USPC ...................................... 137/883, 110, 487.5
    See application file for complete search history.

(56) References Cited

U.S. PATENT DOCUMENTS

| | | | |
|---|---|---|---|
| 8,019,481 B2 | 9/2011 | Yamaguchi et al. | |
| 8,793,082 B2 | 7/2014 | Ding et al. | |
| 8,944,095 B2 | 2/2015 | Okabe | |
| 9,400,004 B2 | 7/2016 | Monkowski et al. | |
| 9,952,078 B2 | 4/2018 | Ding et al. | |
| 10,031,004 B2 | 7/2018 | Ding et al. | |
| 10,031,005 B2 | 7/2018 | Ding | |
| 10,126,761 B2 | 11/2018 | Johnson et al. | |
| 10,184,185 B2 * | 1/2019 | Nakada | G01F 1/34 |
| 10,401,202 B2 * | 9/2019 | Monkowski | G01F 1/34 |
| 10,534,376 B2 * | 1/2020 | Nishino | G05D 7/0641 |
| 11,169,547 B2 * | 11/2021 | Rice | G05D 7/0664 |
| 11,353,352 B2 * | 6/2022 | Somani | G01F 1/48 |
| 11,873,916 B2 * | 1/2024 | Takimoto | G05D 7/0635 |
| 2004/0112435 A1 | 6/2004 | Olander | |
| 2006/0278276 A1 | 12/2006 | Tanaka et al. | |
| 2009/0183549 A1 | 7/2009 | Monkowski et al. | |
| 2011/0108126 A1 | 5/2011 | Monkowski et al. | |
| 2011/0108128 A1 | 5/2011 | Kishimoto et al. | |
| 2014/0083514 A1 | 3/2014 | Ding | |
| 2014/0299206 A1 | 10/2014 | Nagase et al. | |
| 2017/0068256 A1 | 3/2017 | Nair et al. | |
| 2019/0071192 A1 | 3/2019 | Friederich | |
| 2019/0250648 A1 | 8/2019 | Hirata et al. | |
| 2019/0332219 A1 * | 10/2019 | Kong | G06F 3/047 |
| 2020/0033895 A1 | 1/2020 | Sugita et al. | |
| 2020/0224776 A1 | 7/2020 | Yoshida et al. | |
| 2020/0370671 A1 | 11/2020 | Takimoto et al. | |
| 2020/0393051 A1 | 12/2020 | Kondo et al. | |

FOREIGN PATENT DOCUMENTS

| | | |
|---|---|---|
| WO | 2005/124492 A1 | 12/2005 |
| WO | 2018/021327 A1 | 2/2018 |
| WO | 2018/100968 A1 | 6/2018 |
| WO | 2018/180745 A1 | 10/2018 |
| WO | 2019/102882 A1 | 5/2019 |
| WO | 2019/171593 A1 | 9/2019 |

\* cited by examiner

FLUID CONTROL DEVICE, FLUID SUPPLY SYSTEM, AND FLUID SUPPLY METHOD

CROSS-REFERENCE TO RELATED APPLICATIONS

This application is a Divisional of U.S. patent application Ser. No. 18/003,259 filed Dec. 23, 2022, which is the U.S. National Stage of International Application No. PCT/JP2021/022624 filed Jun. 15, 2021, which claims benefit of priority to Japanese Patent Application No. 2020-111466 filed Jun. 29, 2020, the entire contents of which are incorporated herein by reference.

TECHNICAL FIELD

The present invention relates to a fluid control device, a fluid supply system, and a fluid supply method, more particularly, to a fluid control device, a fluid supply system, and a fluid supply method that are used when supplying a gas in a tank to a process chamber, and are capable of stably supplying a fluid even when a primary side fluid pressure fluctuates.

BACKGROUND ART

In a semiconductor manufacturing facility, a chemical plant, etc., a gas needs to be supplied to a process chamber at a desired flow rate. As a flow rate control device for this purpose, a mass flow controller (thermal mass flow controller) or a pressure type flow rate control device is known.

The pressure type flow rate control device is widely used because mass flow rates of various fluids can be controlled with high accuracy by a relatively simple mechanism combining a control valve and a restriction part (for example, an orifice plate or a critical nozzle). Among the pressure type flow rate control devices, there is one that controls a fluid pressure upstream of the restriction part (that is, an upstream pressure) by adjusting an opening degree of a control valve, and flows the fluid downstream of the restriction part at a flow rate corresponding to the upstream pressure. The pressure type flow rate control device has an excellent flow rate control characteristic that stable flow rate control can be performed even in a situation where the primary side supply pressure, that is, the fluid pressure upstream of the control valve greatly fluctuates.

As a control valve of the pressure type flow rate control device, a piezoelectric element driven valve (also referred to as a piezo valve) configured to open/close a metal diaphragm valve element by a piezoelectric element drive device (also referred to as a piezo actuator) is known (for example, Patent Literature 1). The piezoelectric element driven valve has high responsivity and can control the upstream pressure and the flow rate by feedback controlling the piezo actuator based on an output of a pressure sensor.

PRIOR-ART DOCUMENT

Patent Documents

Patent Literature 1: Japanese Laid-Open Patent Application No. 2003-120832
Patent Literature 2: International Publication No. WO2019/171593
Patent Literature 3: International Publication No. WO2018/021327
Patent Literature 4: Japanese Patent No. 3890138
Patent Literature 5: International Publication No. WO2018/180745

SUMMARY OF INVENTION

Technical Problem

The above-described piezoelectric element driven valve is suitably used for accurately controlling the flow rate of a gas at a small flow rate, but on the other hand, it may be difficult to flow a gas at a large flow rate. This is because there is a limit to the range of valve opening/closing that can be controlled by the extension of the piezoelectric element (also referred to as a piezo element). In addition, in the pressure type flow rate control device, since the gas is supplied through the restriction part, there is also a problem that the flow of the gas is always restricted, and it is hardly to flow the gas at a large flow rate.

For this reason, in an application requiring a large flow rate, the use of another type of valve or a flow rate control device has been considered. For example, Patent Literature 2 by the present applicant discloses a valve device configured by combining a main actuator that performs an opening/closing operation by pneumatic pressure and a piezo actuator for adjusting an opening degree. In the valve device described in Patent Literature 2, the valve can be largely opened by using the main actuator, and fine adjustment of the opening degree can be performed by the piezo actuator, so that even a gas can be supplied at a relatively large flow rate by controlling the flow rate.

However, the valve device described in Patent Literature 2 is provided downstream of the fluid control device having a mass flow controller or the like, and functions as an on-off valve also capable of fine adjustment of the flow rate. Therefore, the flow rate control by the fluid control device is used in a situation where the primary side fluid pressure of the valve device is substantially constant, the application in which the primary side fluid pressure fluctuates significantly is not envisioned.

Therefore, there is a demand for a fluid control device capable of not only flowing a fluid at a relatively large flow rate, but also stably supplying the fluid downstream even when the fluid supply is performed while a primary side fluid pressure fluctuation is accompanied, such as when supplying a fluid in a tank.

An object of the present invention is to provide a fluid control device, a fluid supply system, and a fluid supply method that are suitably used for stably supplying a fluid with pressure fluctuations.

Solution to Problem

A fluid control device according to an embodiment of the present invention comprises: a valve device including an actuator for opening/closing a flow path and adjusting a flow rate of a fluid flowing in the flow path; a pressure sensor provided upstream of the valve device; and a control circuit connected to the valve device and the pressure sensor, wherein the control circuit controls an operation of the actuator based on a pressure measured by the pressure sensor and a reference pressure drop curve while the upstream of the fluid control device is closed and the valve device is kept open using the actuator.

In one embodiment, the valve device includes: a main actuator operated by a driving fluid; a sub-actuator extendable by an electrical drive; and a valve element operable by the main actuator and the sub actuator.

In one embodiment, the valve device further includes: an operating member that is moved by the main actuator and the sub-actuator, and an elastic member that biases the sub-actuator toward the valve element, and is configured so that the main actuator moves the operating member against the biasing force of the elastic member, and the biasing force of the elastic member is increased by the extension of the sub-actuator to move the operating member.

In one embodiment, the valve device comprises: a main valve including an actuator and a valve element operated by a driving fluid, and a sub valve including an actuator and a valve element extendable by an electric drive.

In one embodiment, a branch flow path is formed downstream of the pressure sensor, the main valve is provided to an end of the branch flow path, and the sub-valve is provided in another end of the branch flow path.

In one embodiment, the fluid control device further includes an opening/closing detection device for determining the opening/closing of the valve device.

In one embodiment, the opening/closing detection device includes a limit switch.

In one embodiment, the actuator includes an actuator that is extendable by an electric drive, and the opening/closing detection device detects the opening/closing of the valve element by a change in a voltage supplied to the actuator.

In one embodiment, the control circuit is configured to be able to obtain a reference pressure drop curve by measurement using the pressure sensor when a reference flow is occurring, it is also configured to determine an approximate polynomial based on the reference pressure drop curve, and to control an operation of the actuator based on a difference between a pressure value at a predetermined time according to the determined approximate polynomial and a pressure value at the predetermined time measured by the pressure sensor.

In one embodiment, the control circuit is configured to correct a control command value of the actuator based on the reference pressure drop curve, based on a difference between a pressure value at a predetermined time according to the approximate polynomial and a pressure value at the predetermined time measured by the pressure sensor, and to control an operation of the actuator based on the corrected control command value.

The fluid supply system according to an embodiment of the present invention comprises a fluid supply source, an upstream on-off valve provided downstream of the fluid supply source, a tank provided downstream of the upstream on-off valve, and the fluid control device according to any one of the above items provided downstream of the tank.

In one embodiment, the control circuit of the fluid control device controls the operation of the actuator based on the reference pressure drop curve when the gas stored in the tank is supplied via the fluid control device while the upstream on-off valve is kept closed.

The fluid supply method according to one embodiment of the present invention is performed using the fluid supply system described above, and comprises: a step of storing the gas from the fluid supply source in the tank while the upstream on-off valve is opened and the valve device of the fluid control device is kept closed; a step of closing the upstream on-off valve after the gas is stored; and a step of opening the valve device of the fluid control device and supplying the gas stored in the tank after the upstream on-off valve is closed, wherein the step of supplying the gas stored in the tank includes a step of controlling an operation of the actuator based on a pressure measured by the pressure sensor and a reference pressure drop curve.

In one embodiment, the fluid supply method comprises: a step of closing the valve device of the fluid control device after the step of supplying the gas to end a first process, and a step of opening the upstream on-off valve after closing the valve device of the fluid control device to store the gas in the tank, and then closing the upstream on-off valve to open the valve device of the fluid control device to perform the gas supply in a subsequent second process, wherein the reference pressure drop curve is determined using the pressure sensor during the gas supply of the first process, and in the subsequent process after the first process, the operation of the actuator is controlled using the reference pressure drop curve determined in the first process.

Effect of Invention

According to the fluid control device of the embodiment of the present invention, it is possible to stably supply a fluid accompanied by a primary side pressure fluctuation, such as suppling a gas in a tank.

DESCRIPTION OF EMBODIMENTS

Embodiments of the present invention will be described below with reference to the drawings, but the present invention is not limited to the following embodiments.

Figure 1:
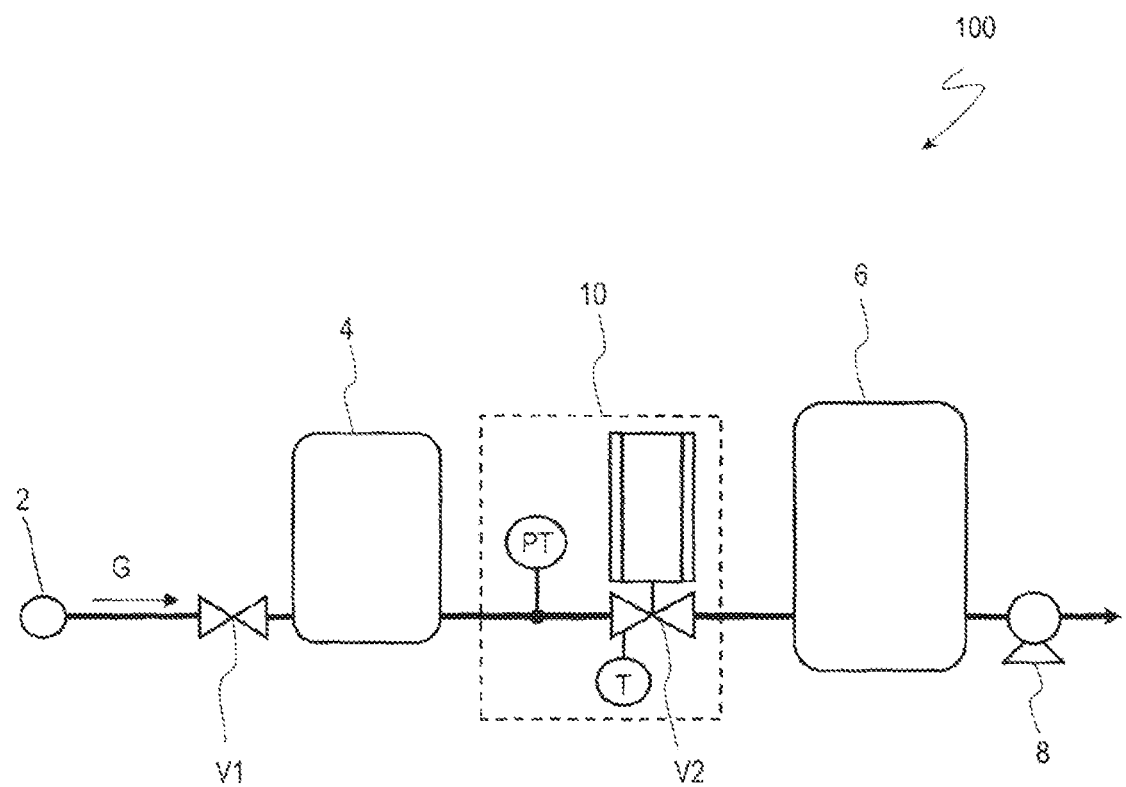
FIG. 1 illustrates the fluid supply system incorporating the fluid control device according to an embodiment of the present invention.

FIG. 1 illustrates a fluid supply system 100 incorporating a fluid control device 10 according to an embodiment of the present invention. The fluid supply system 100 has a gas supply source 2; an upstream on-off valve V1 provided downstream of the gas supply source 2; a tank 4 connected downstream of the upstream on-off valve V1, and a fluid control device 10 provided downstream of the tank 4.

A process chamber 6 in which a gas G is used is connected to a downstream side of the fluid control device 10. A vacuum pump 8 is connected to the process chamber 6. The vacuum pump 8 is used for evacuating the inside of the process chamber 6 and the flow path.

The fluid supply system 100 controls the flow rate of the gas G supplied from the gas supply source 2 and stored in the tank 4 using the fluid control device 10, and supplies the gas G to the process chamber 6. For this object, the fluid control device 10 includes a valve device V2 of which opening degree can be finely adjusted, a pressure sensor PT provided upstream of the valve device V2, and a temperature sensor T provided in the valve device V2. The fluid control device 10 is configured to control the opening degree of the valve device V2 in accordance with an output of the pressure sensor PT (and the temperature sensor T).

As the upstream on-off valve V1, a fluid driven valve such as AOV (Air Operated Valve) or a valve (on-off valve) having excellent responsivity and shut-off property is preferably used, such as a solenoid valve or an electrically operated valve. On the other hand, as the valve device V2 with an adjustable opening degree, a valve of which opening degree can be finely adjusted by using a piezo actuator or the like is preferably used. However, in the present embodiment, as will be described later, a valve device V2 having an integrated structure combining a piezoelectric actuator and a fluid driven valve is used.

In addition, the valve device V2 may be configured by using a plurality of valves instead of using a single valve, for example, the valve device V2 may be configured by a piezoelectric valve and a fluid driven valve being arranged in series or in parallel. Hereinafter, in the present specification, "the valve device V2 is closed" means that at least one valve is closed and the flow path of the fluid control device 10 is closed, and "the valve device is open" means that at least one valve is open and the flow path of the fluid control device 10 is open.

In the fluid supply system 100, first, the upstream on-off valve V1 is opened while the valve device V2 of the fluid control device 10 is closed, and the gas is filled into the tank 4 from the gas supply source 2. Thereafter, the flow path including the tank 4 is closed by closing the upstream on-off valve V1. And then, by opening the valve device V2 of the fluid control device 10, the gas in the tank 4 is supplied to the process chamber 6. At this time, by adjusting the opening degree of the valve device V2 of the fluid control device 10, it is possible to control the flow rate of the gas flowing out of the tank 4.

Further, after supplying only a desired amount of the gas in the tank 4 to the process chamber 6, and then stop supplying by closing the valve device V2 of the fluid controlling device 10. Thereby, one process is completed. Then, by opening the upstream on-off valve V1, the tank 4 is refilled with gas, and a subsequent process can be performed in the same manner as described above. In this manner, the fluid supply system 100 can repeatedly supplying the gas, which was supplied to the tank 4, to the process chamber 6.

Figure 2:
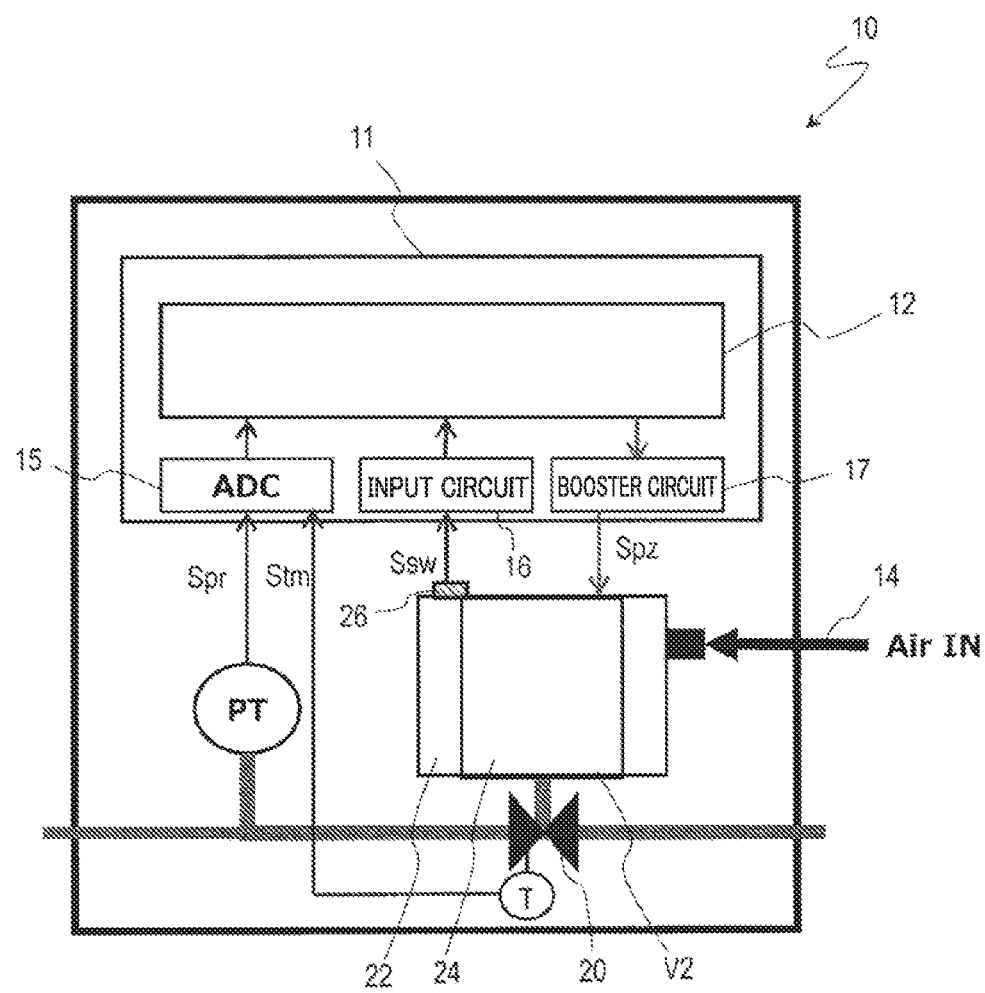
FIG. 2 illustrates a more detailed configuration of the fluid control device according to an embodiment of the present invention.
Figure 3:
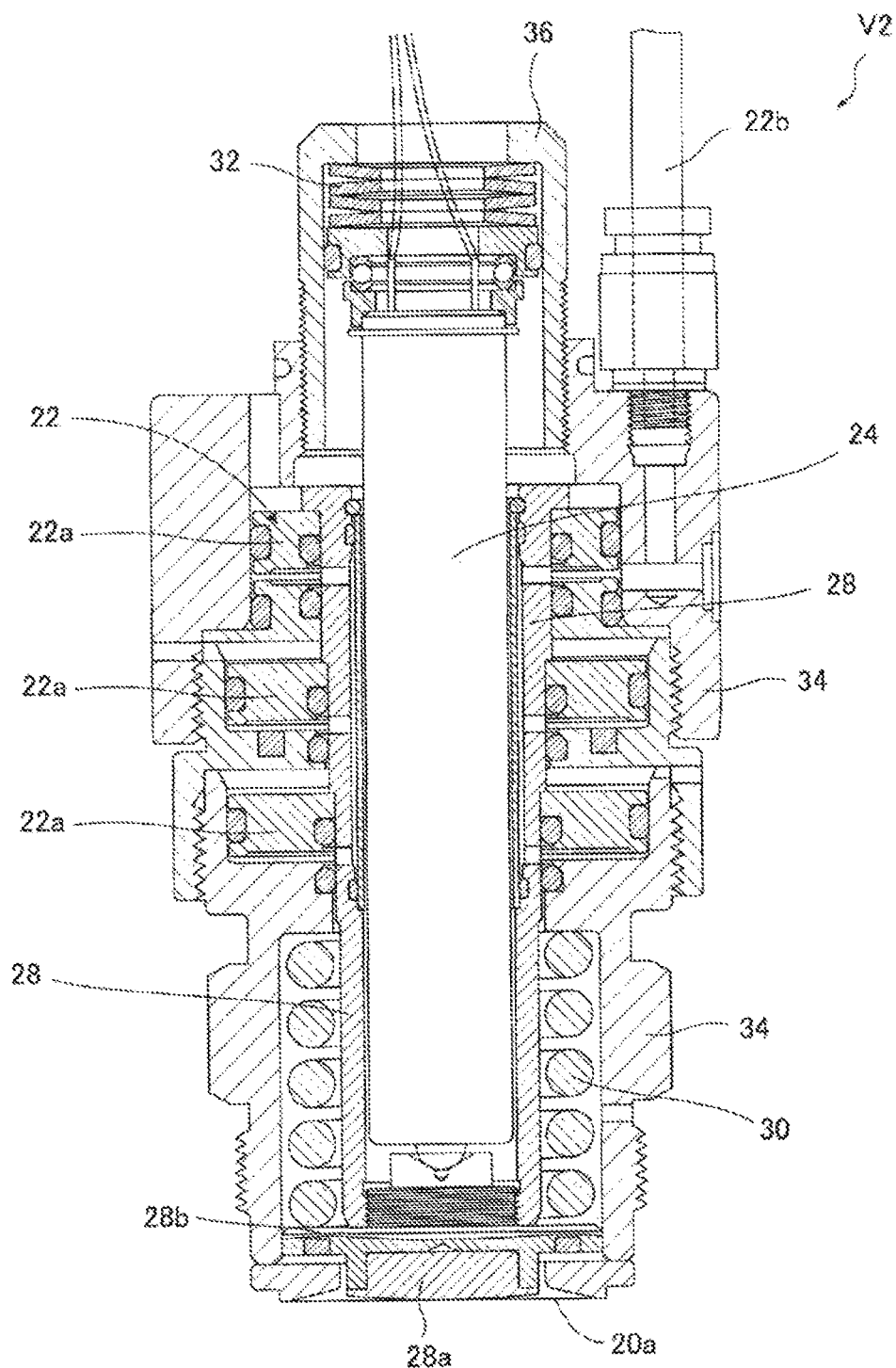
FIG. 3 illustrates a specific example of an opening degree adjustable valve provided in the fluid control device according to an embodiment of the present invention.

FIG. 2 illustrates a more detailed configuration of the fluid control device 10, and FIG. 3 illustrates a detailed configuration of the valve device V2 included in the fluid control device 10.

As illustrated in FIG. 2, the fluid control device 10 includes a pressure sensor PT, a temperature sensor T, a valve device V2 having an adjustable opening degree, and a control circuit 12 for controlling an operation of the valve device V2 based on an output of the pressure sensor PT.

In the present embodiment, the valve device V2 includes a main actuator 22 for opening/closing a valve mechanism 20 by using compressed air as a driving fluid, and a sub actuator 24 for electrically opening/closing the valve mechanism 20 by using piezoelectric elements. The valve device V2 can be largely opened/closed by supplying a compressed air 14, and the opening degree can be adjusted more precisely by controlling the applied voltage to the piezoelectric element (piezoelectric drive signal Spz). Such a valve is disclosed in Patent Literature 2 and JPA 2021-32391 by the present applicant. For reference, the entire disclosure of JPA 2021-32391 is incorporated herein by reference.

Further, the valve device V2 is provided with an opening/closing detection device 26 for detecting opening/closing of the valve element. As the opening/closing detection device 26, a limit switch is mainly used. The limit switch is constituted by an electric contact arranged to be able to abut on an upper end of the operating member which is moved by the main actuator 22, and can generate a signal (opening/closing detection signal Ssw) indicating the actual opening/closing of the valve based on an energization of the contact point. A fluid-driven valve with a limit switch is disclosed, in Patent Literature 3 (WO2018/021327), for example.

The control circuit 12 may receive the pressure signal Spr indicating the fluid pressure measured by the pressure sensor PT and the temperature signal Stm indicating the temperature measured by the temperature sensor T via an AD converter 15, and may receive the opening/closing detection signal Ssw from the opening/closing detection device 26 via an input circuit 16. In addition, the control circuit 12 can apply a driving voltage to the sub actuator (piezoelectric actuator) of the valve device V2 by using a booster circuit 17. The booster circuit 17 is used to convert a control signal from the control circuit 12 into a driving voltage to be applied to the piezoelectric element.

The opening/closing detection device 26 may be any device as long as the opening/closing of the valve element can be detected, and may be a device that detects the opening/closing state from a change in the piezoelectric voltage other than the limit switch, or a device that detects the opening/closing state by measuring the height of a pistons 22a or the like using a laser, a proximity sensor, etc.

In the present embodiment, the control circuit 12, the AD converters 15, the inputting circuit 16, and the boosting circuit 17 are provided on a circuit board 11 built in the fluid control device 10. However, the present invention is not limited thereto, and at least one of them may be provided outside the fluid control device 10. The control circuit 12 is typically a digital signal processing circuit including a CPU, a memory, and the like, and includes a computer program for executing an operation to be described later. The control circuit 12 can be realized by a combination of hardware and software.

FIG. 3 illustrates a more specific exemplary configuration of the valve device V2 (however, the opening/closing detection device 26 is omitted). As illustrated, the valve device V2 includes an operation member 28 for opening/closing a diaphragm valve element 20a, a main actuator 22 for largely moving the operating member 28, and a sub actuator 24 for smally moving the operating member 28.

In the present embodiment, the valve device V2 is a normally closed valve, and when the main actuator 22 and the sub actuator 24 are not driven, the diaphragm valve element 20a is pressed against a valve seat (not shown) by a biasing force received from a main elastic member (here, a coiled spring) or the like via the operating member 28 and a valve element pusher 28a fixed to a distal end thereof. The valve seat is usually provided as an annular protruding surface provided adjacent to the center of the diaphragm valve element 20a.

As the main actuator 22, an air-driven actuator that moves the operating member 28 up and down using compressed air as a driving fluid is used. The main actuator 22 includes a plurality of annular pistons 22a, and is able to move the operating member 28 up and down by suppling compressed air through a supply pipe 22b.

In addition, a pressure regulator (e.g., an electropneumatic regulator) for supplying compressed air of an arbitrary pressure to the pistons 22a may be connected to the supply pipe 22b. By using the pressure regulator, the valve opening degree can be adjusted stepwise by adjusting the operating pressure of the main actuator 22 to an arbitrary magnitude. However, the main actuator 22 may be configured to perform only the opening/closing operation of the valve device V2 by controlling the supply/stop of the high-pressure air using a solenoid valve or the like, without providing the pressure regulator.

As the sub actuator 24, a piezo actuator may be used. The sub actuator 24 is slidably disposed inside of the operating member 28 with respect to the operating member 28. In the sub actuator 24, the degree of elongation thereof is controlled by controlling the voltage to be applied to the piezoelectric element.

Furthermore, the valve device V2 includes a lower elastic member 30 (here, a coiled spring) abutting on a flange portion 28b of the operating member 28, and an upper elastic member (here, a Belleville spring) 32 positioned above the sub actuator 24. The upper end of the lower elastic member 30 and the upper elastic member 32 are restricted respectively by a body 34 and a cap 36 that are stationary portions and the lower elastic member 30 can bias the operation member 28 downward, and the upper elastic member 32 can bias the sub actuator 24 downward.

In the valve device V2 having the above described configuration, when the main actuator 22 and the sub actuator 24 are not driven, the diaphragm valve element 20a is pressed against the valve seat by the biasing force of the lower elastic member 30 that presses the flange portion 28b of the operating member 28 downward and the biasing force of the upper elastic member 32 that presses the sub actuator 24 downward.

On the other hand, to open the valve, compressed air is supplied to the main actuator 22, against the biasing force of the lower elastic member 30 and the upper elastic member 32, the main actuator 22 lifts the operating member 28 upward by the pistons 22a. At this time, since the load is balanced, the movement of the operation member 28 is relatively smoothly performed, and it is easy to adjust the opening degree corresponding to the operation pressure. Furthermore, the valve opening degree can be adjusted more precisely by controlling the voltage to be applied to the sub actuator 24 while opening the valve using the main actuator 22.

In this manner, by using the valve device V2 capable of performing the opening/closing operation by the main actuator 22 and the fine adjustment of the opening degree by the sub actuator 24, it is possible to not only flow a gas having a large flow rate with high responsivity, but also accurately control the flow rate of the gas by precisely adjusting the opening degree.

In addition, it is possible to use only one actuator and one valve as the valve device V2, as long as both the opening/closing operation and the opening degree fine adjustment can be realized by only any one of the main actuator and the sub actuator.

Furthermore, the main actuator and the sub actuator are not necessarily provided in one valve, but may be provided in separate valves. In this case, each valve may be provided in the same flow path, or may be provided in a branch flow path by branching the flow path.

Figure 4:
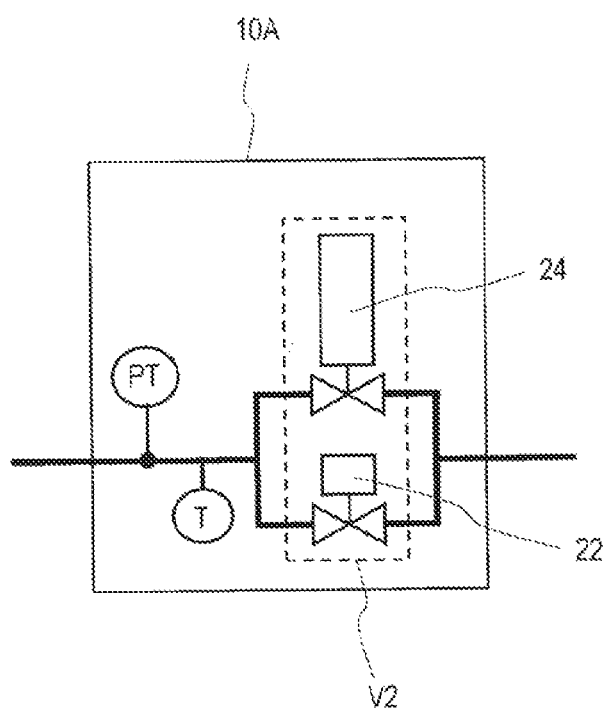
FIG. 4 illustrates a configuration of the fluid control device according to another embodiment of the present invention.

FIG. 4 illustrates a fluid control device 10A in which each of the branch flow paths is provided with a valve. In the fluid control device 10A, the valve device V2 is configured by a valve V2a (sometimes referred to as a main valve) including the main actuator 22 and a corresponding valve element, and a valve V2b (sometimes referred to as a sub valve) including the sub actuator 24 and a corresponding valve element. The main valve V2a and the sub valve V2b constituting the valve device V2 are respectively installed in the branched flow paths downstream of the pressure sensor PT, and it is possible to not only speedily open/close the flow path using the main valve V2a, but also finely adjust the flow rate of the gas flowing downstream of the fluid control device 10A by using the sub valve V2b.

In the fluid control device 10A, a temperature sensor T is provided to measure the body temperature of the main valve V2a, but is not limited thereto. The temperature sensor T may be provided in each of the main valve V2a and the sub valve V2b, or may be provided in a common flow path in the vicinity of the pressure sensor PT. The temperature sensor may be provided in any manner as long as the temperature of the valve device V2 or the gas temperature can be appropriately measured.

Referring again to FIG. 1, the operation of the fluid control device 10 will be described. The fluid control device 10 is configured to measure a pressure drop using the pressure sensor PT when opening the valve device V2 to allow the gas in the tank to flow out after closing the upstream on-off valve V1. Then, when the measured pressure drop is different from the reference pressure drop curve given in advance, the operation of the sub actuator 24 is controlled so that the pressure matches the reference pressure drop curve.

This allows the supply of the gas in the tank to follow the reference pressure drop curve in each process. Therefore, it is possible to perform a stable gas supply in which variation in each process is reduced.

As the reference pressure drop curve, typically, a pressure drop curve measured using the pressure sensor PT in a process executed at first, sometimes referred to as a first process, is used. By determining the reference pressure drop curve in this manner, it is possible to perform gas supply in the second and subsequent processes with a gas flow as same as that of the first process. Thus, even in the gas supply mode in which the primary side pressure fluctuates, it is possible to perform the gas supply with the same pressure fluctuation and to realize a stable gas supply each time.

However, the reference pressure drop curve does not necessarily have to be obtained in the first process, and may be obtained in an intermediate process and reflected in a subsequent process. Further, the reference pressure drop curve is not limited to the one obtained by measurement in a process, and may be one obtained in advance by measurement under an ideal environment, or may be one set as an ideal curve regardless of measurement.

Figure 5:
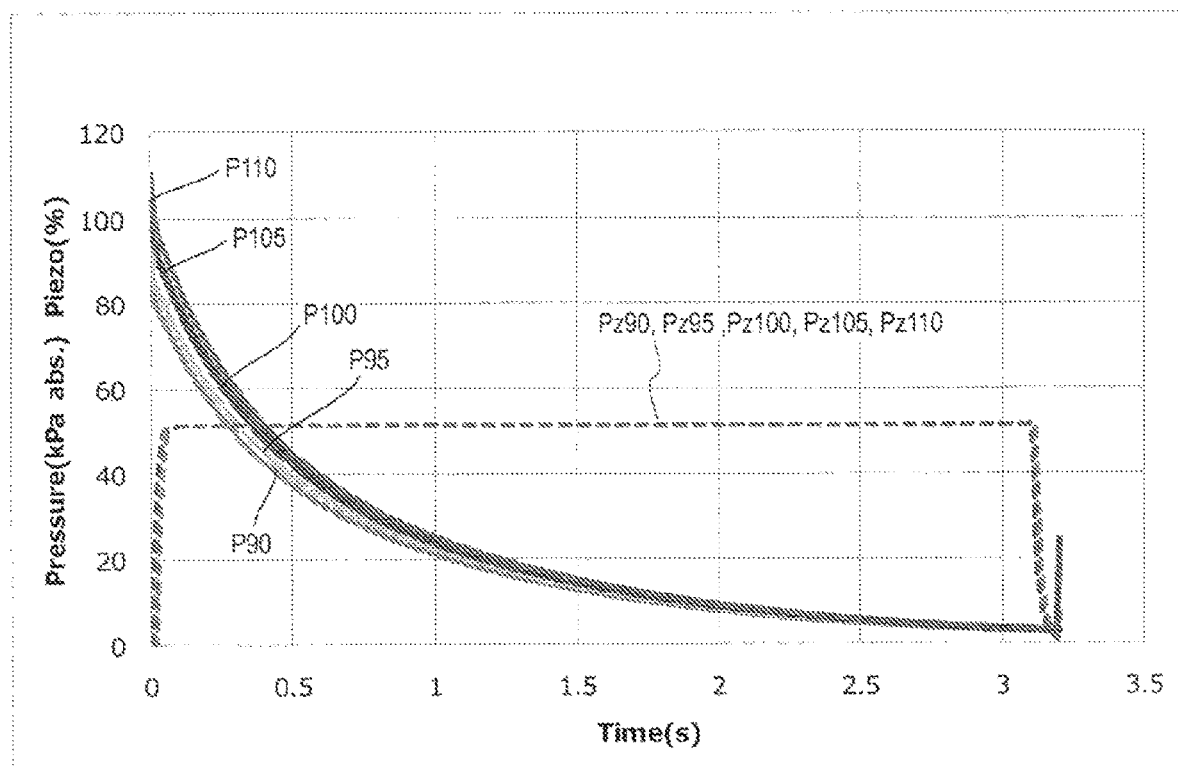
FIG. 5 is a graph illustrating the pressure drops after opening the opening degree adjustable valve (drops of the gas pressure in the tank).

Hereinafter, the reason for controlling the flow rate at the time of gas supply using the reference pressure drop curve will be described. FIG. 5 illustrates a pressure drop curve after opening the valve device V2 in a comparative example, in particular, illustrates respective pressure drop curves P90-P110 when the initial tank pressure differs at 90-110 kPa abs. In this case, the graph when the initial pressure is 100 kPa abs (P100) is set as the reference pressure drop curve. In addition, FIG. 5 also illustrates the driving voltage Pz90-Pz110 of the piezoelectric element, and in this comparative example, the driving voltage of the piezoelectric element is fixed to be constant at 50% regardless of the initial pressure.

Note that the graph P90, P95, P100, P105 and P110 indicates a pressure drop curve at an initial pressure 90 kPa, 95 kPa, 100 kPa, 105 kPa and 110 kPa, respectively, and the graph Pz90, Pz95, Pz100, Pz105, Pz110 indicates a piezo drive voltage at an initial pressure 90 kPa, 95 kPa, 100 kPa, 105 kPa and 110 kPa respectively.

As can be seen from FIG. 5, after opening the valve device V2 using the main actuator, the gases flow out over time and the pressure drops, regardless of the initial pressure in the tank. At this time, the pressure downstream of the valve device V2 is maintained at a vacuum pressure (100 torr or less) by using a vacuum pump, for example.

However, it can be seen that the pressure drop curve P90-P110 is slightly different due to the difference in the initial pressure, resulting in a difference in the flow of the gas being supplied. When a difference occurs in the flow of the gas in this way, the flow rate of the gas supplied to the process chamber and the entire supply amount of the gas supplied in a certain period of time become different for each initial pressure. As a result, a stable process may not be continuously performed.

In order to suppress the change in the gas flow due to the initial pressure, it is conceivable to control the gas pressure in the tank so that the initial pressure becomes constant based on the measurement by the pressure sensor when the gas is stored in the tank. Initial pressure can be controlled by adjusting the timing of closing the upstream on-off valve V1.

However, in reality, it may be difficult to keep the gas pressure in the tank constant for each process depending on the environment at the time of gas storage. Further, even if the initial pressure can be made constant, the pressure drop curve when the valve device V2 is opened differs depending on the machine difference of the valve device V2, the volume of the tank, the fluid, or the temperature of the environment, and the like. It is also conceivable that the flow rate characteristics of the valve device V2 change over time. Therefore, in order to perform stable gas supply, it is preferable to set the reference pressure drop curve in advance and adjust the opening degree of the valve device V2 based on the reference pressure drop curve for each process.

Patent Literature 4 discloses a technique for detecting an abnormality in a restriction part using a pressure drop characteristic upstream of the restriction part in a pressure-type flow rate control device. In addition, Patent Literature 5 discloses that, at the time of the flow rate falling, the drive control of the piezo valve is performed with reference to a reference pressure drop characteristic. However, neither of the patent documents discloses nor suggests the flow control performed with reference to the reference pressure drop characteristic when supplying the fluid through a valve, accompanied by the primary side pressure drop, while the upstream on-off valve is closed, as in the fluid control device of the present embodiment.

Figure 6:
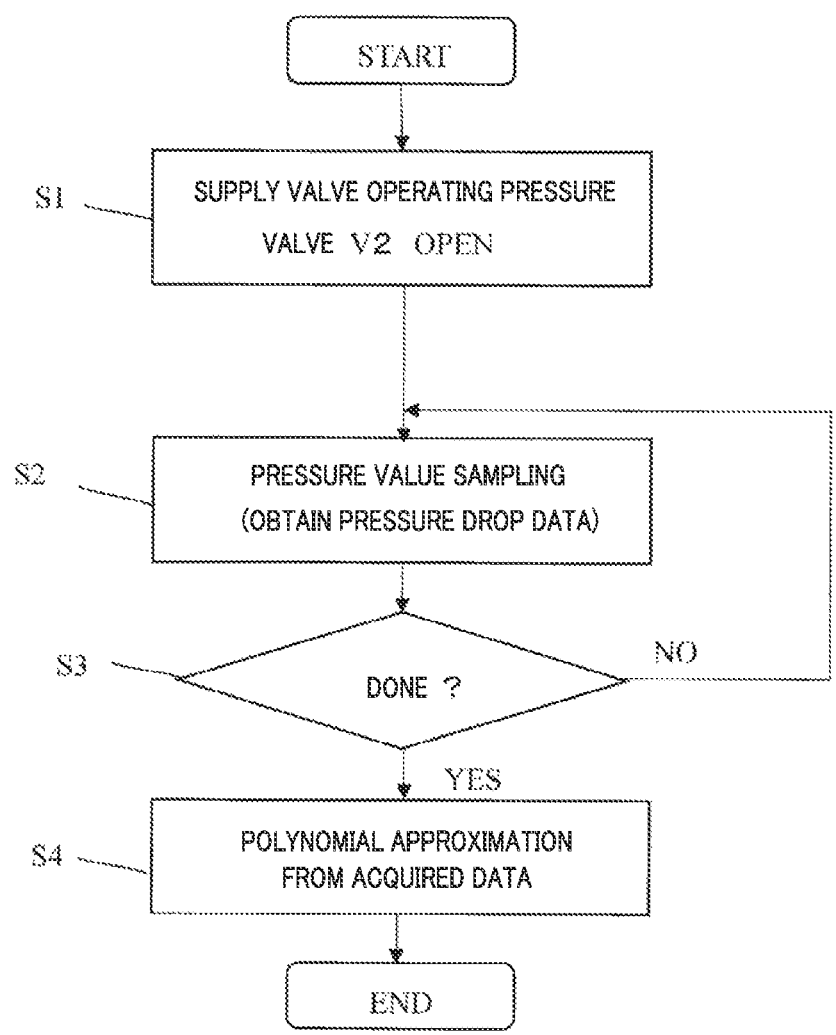
FIG. 6 is a flowchart illustrating a procedure for obtaining the reference pressure drop curve and its approximate expression.
Figure 7:
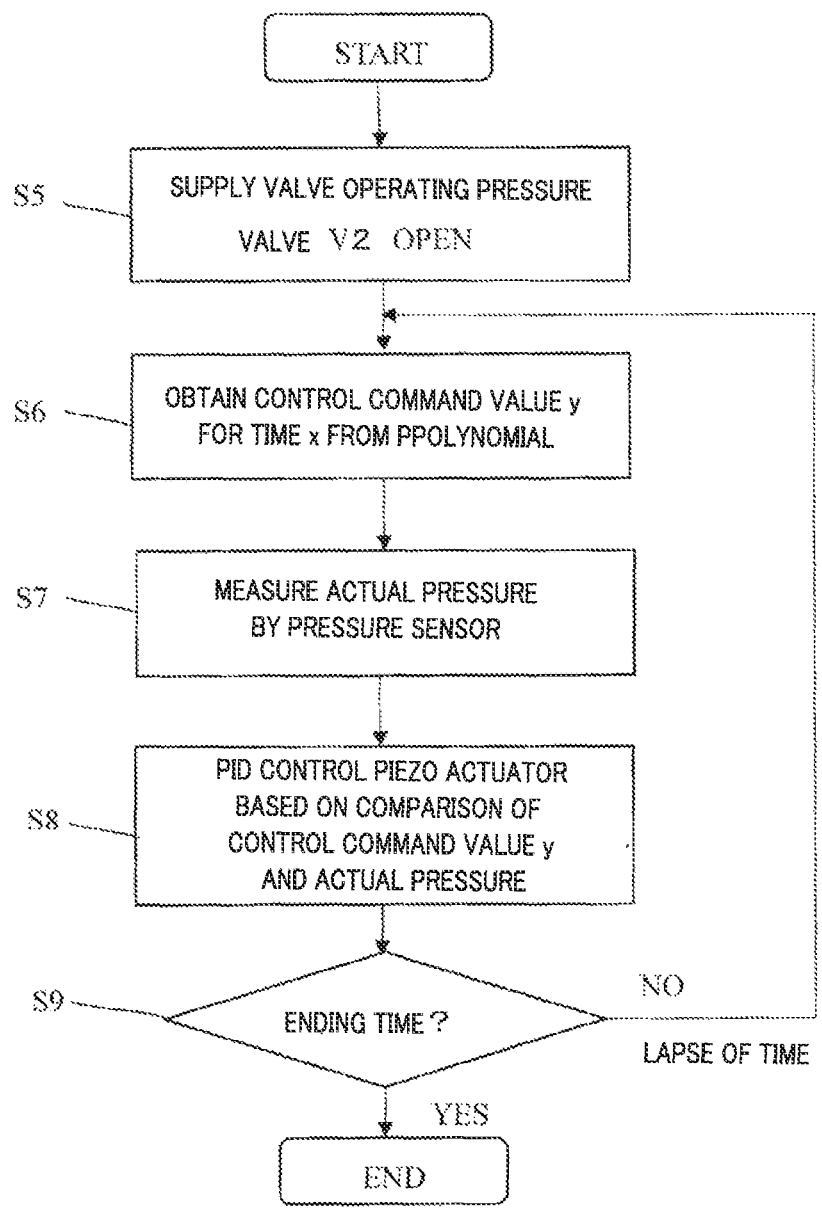
FIG. 7 is a flowchart illustrating a procedure for controlling the driving voltage of the piezo actuator based on the reference pressure drop curve.

Hereinafter, a specific control procedure of the valve device V2 will be described. FIG. 6 and FIG. 7 are exemplary flow charts illustrating adjustments of the opening degree of the valve device V2 in accordance with a reference pressure drop curve. FIG. 6 illustrates a flow for obtaining an approximate polynomial corresponding to the reference pressure drop curve by polynomial regression, and FIG. 7 illustrates a flow for controlling the operation of the valve device V2 based on the obtained approximate polynomial (reference equation) and the measured pressure.

First, as shown in step S1 of FIG. 6, in order to obtain a reference pressure drop curve, a valve operating pressure is supplied to the main actuator of the valve device V2 from a state where the gas is stored and sealed in the tank, thereby opening the valve device V2 and generating a reference flow. As a result, the gas stored in the tank in the sealed state (the upstream on-off valve V1 is closed) rapidly flows out to the downstream side through the valve device V2, and the pressure in the tank also decreases. At this time, as shown in steps S2-S3, the pressure upstream of the valve (corresponding to the tank pressure) is sampled by using the pressure sensor. Sampling is continued, for example, until the output of the pressure sensor reaches a preset lower limit set value, or until a predetermined time has elapsed.

Note that the time at which the valve device V2 is opened in step S1 can be accurately specified by using the opening/closing detection device 26. This makes it possible to more accurately measure the pressure drop from the time when the valve is actually opened to the time when the predetermined period has elapsed.

After the pressure drop data has been obtained by sampling, as shown in step S4, an approximate polynomial is derived from the obtained data by software processing (polynomial regression). The order of the polynomial may be appropriately set, for example, it may be set to a sextic equation. Here, the approximate equation is expressed in a form such as $y = a_1 x^6 + a_2 x^5 + a_3 x^4 + a_4 x^3 + a_5 x^2 + a_6 x + a_7$, where y is a pressure correspondence, x is a time, and $a_1$-$a_7$ are coefficients corresponding to the approximate curve, and are coefficients determined based on the pressure drop data.

Figure 8:
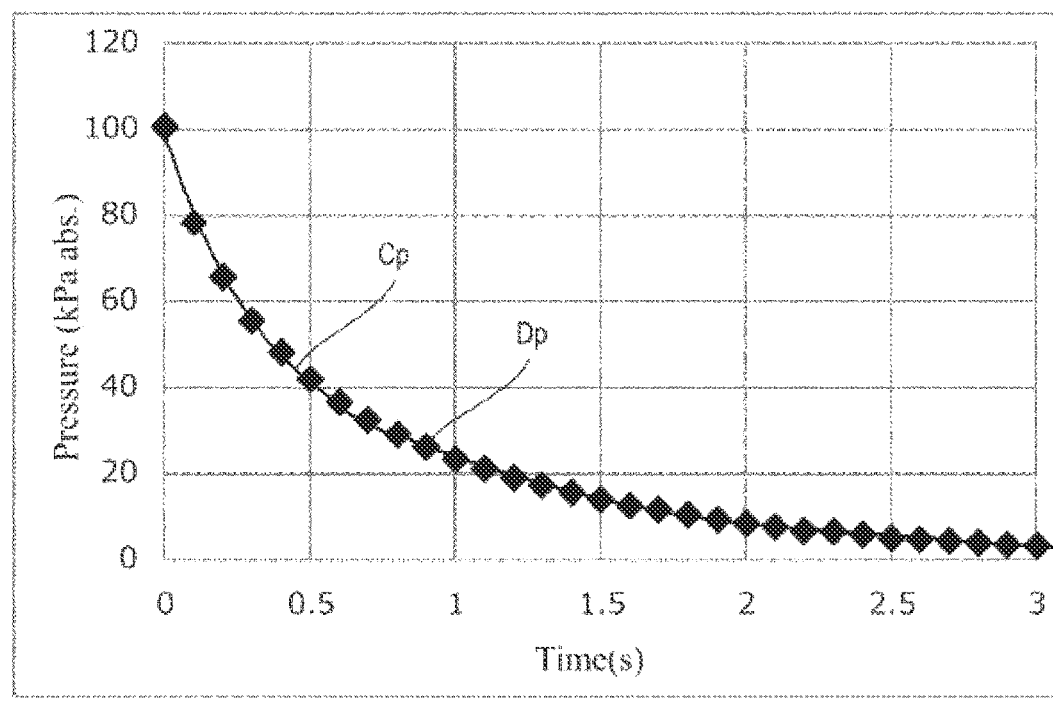
FIG. 8 is a graph illustrating pressure sampling data and an approximation curve when a sextic approximation polynomial is used.

FIG. 8 illustrates a pressure drop data (sampled data) Dp obtained by measurement, and a function graph Cp corresponding to the approximate polynomial obtained from the pressure drop data. In this case, it can be seen that the sampling period is set to 100 ms, and a sufficiently approximate curve can be obtained by using the sextic polynomial.

After the approximate polynomial corresponding to the reference pressure drop curve is obtained in this manner, a valve control operation is performed in a subsequent process to match the reference pressure drop curve.

In the subsequent process, as shown in step S5 of FIG. 7, the valve device V2 is opened to allow the gas in the tank to flow out from the state where the gas is stored and sealed in the tank. At this time, the pressure upstream of the valve is measured using the pressure sensor PT, and similarly, the temperature of the gas is measured using the temperature sensor T.

Next, as shown in step S6, the control command value y (target pressure value based on the reference pressure drop curve) for the present time x is obtained by calculation using the previously determined approximate polynomial. In addition, as shown in step S7, the present actual pressure measured using the pressure sensor can be obtained. The calculation of the control command value y (step S6) and the acquisition of the present pressure value (step S7) may be performed vice versa or may be performed simultaneously.

Further, in step S7, the temperature at the present pressure may be corrected based on the temperature measured by using the temperature sensor T. This is for reducing the temperature dependency of the output of the pressure sensor PT, and the measured pressure may be corrected according to the temperature based on the temperature dependence information (temperature-pressure coefficient table, etc.) stored in advance in the memory of the control circuitry 12, for example. In this way, a more accurate pressure value can be obtained regardless of the temperature, and the flow rate can be controlled more appropriately.

Next, as shown in step S8, feedback control based on the current pressure value is performed, specifically, the current pressure value is compared with the control command value y, and the piezoelectric actuator is PID controlled. As a result, the opening/closing operation of the valve is performed so as to approach the control command value y.

Here, the reference driving voltage of the sub actuator (piezoelectric actuator) 24 of the valve device V2 is set to 50% of the rated voltage (voltage corresponding to the set maximum opening degree). In this case, in step S8, when the present pressure value is lower than the control command value y, the piezo drive voltage can be increased more than the reference value, and the valve opening degree can be slightly decreased, so that the pressure value can be brought close to the control command value y. In addition, when the current pressure value exceeds the control command value y, the piezoelectric drive voltage can be decreased from the reference value, and the valve opening degree can be slightly increased, so that the pressure value can be brought close to the control command value y.

The PID control of the piezo actuator based on the reference pressure drop curve (here polynomial) is continued until the ending time is confirmed in step S9. At the ending time, the current pressure value may be less than the predetermined value, or the predetermined time may have elapsed.

Figure 9:
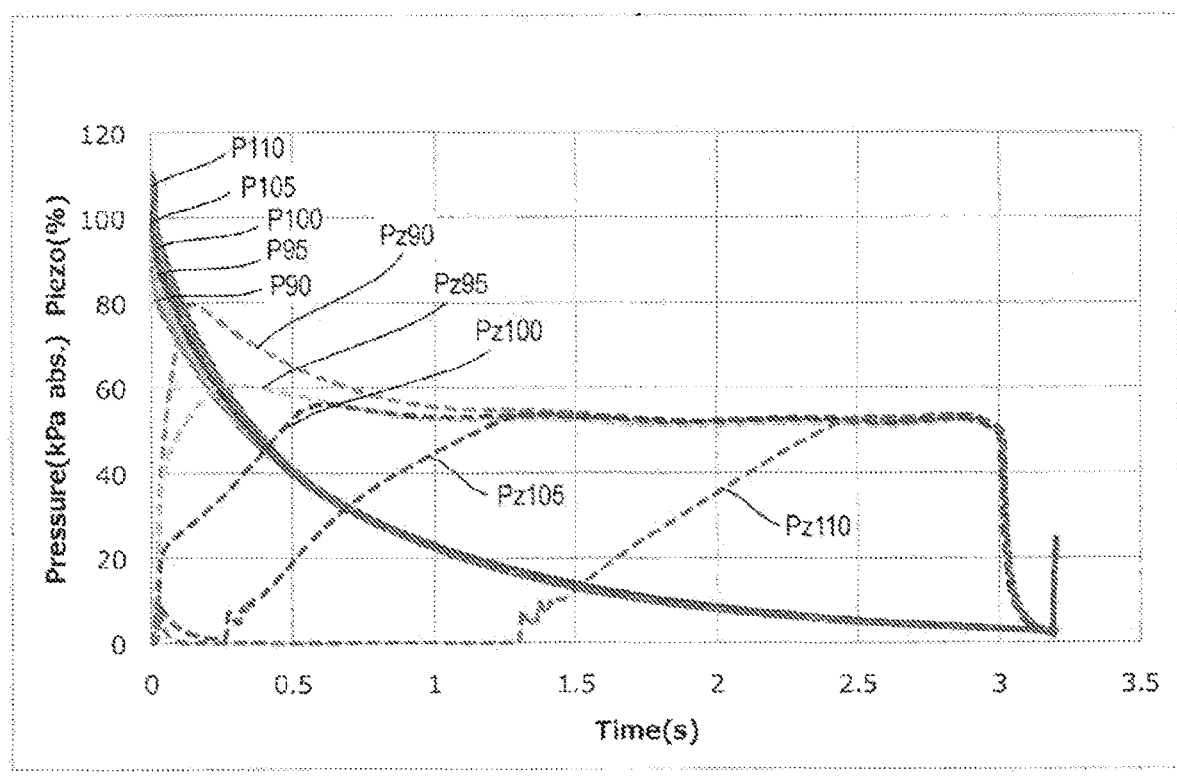
FIG. 9 is a graph illustrating the pressure drop and changes in piezo driving voltage according to the valve operation control based on the pressure measurement of an embodiment of the present invention.

FIG. 9 is a graph illustrating pressure drop curves (solid line) P90-P110 and piezo drive voltages (dashed line) Pz90-Pz110 resulting from the valve operation control described above. When the reference initial pressure is 100 kPa (P100), the initial pressure may be higher (P105, P110) than it, or may be lower (P90, P95) than it.

As can be seen from FIG. 9, when the initial pressure (90 kPa, 95 kPa) is less than the reference value (100 kPa), the valve opening degree is slightly reduced by increasing the piezo drive voltage (Pz90, Pz95) by more than 50%, thereby increasing the pressure and controlling the valve opening degree so as to approach the reference pressure drop curve. As time progresses, the pressure drop curve approaches the reference pressure drop curve, while the piezo drive voltage (Pz90, Pz95) moves back to 50% of the reference value.

When the initial pressure (105 kPa, 110 kPa) is larger than the reference value, the valve opening degree is slightly increased by decreasing the piezo drive voltage (Pz105, Pz110) by more than 50%, thereby decreasing the pressure, and the valve opening degree is controlled so as to approach the reference pressure drop curve. As time progresses, the pressure drop curve approaches the reference pressure drop curve, while the piezo drive voltage moves back to 50% of the reference value.

In the valve device V2 according to the present embodiment, driving fluid is not supplied to the main actuator when the valve device is closed, and the driving voltage of the sub actuator is set to 0. Therefore, even when the initial pressure is the reference value (100 kPa), it is possible to confirm an operation in which the driving voltage Pz100 of the piezo actuator is increased to 50% of the reference value due to the PID control after the valve is released.

Next, another embodiment for more quickly shifting to the reference pressure will be described. In the present embodiment, the control command value y is corrected based on the outputs of the pressure sensor PT and the temperature sensor T, and the driving voltage of the sub actuator (piezo actuator) of the valve device V2 is controlled based on the corrected control command value y'.

Figure 10:
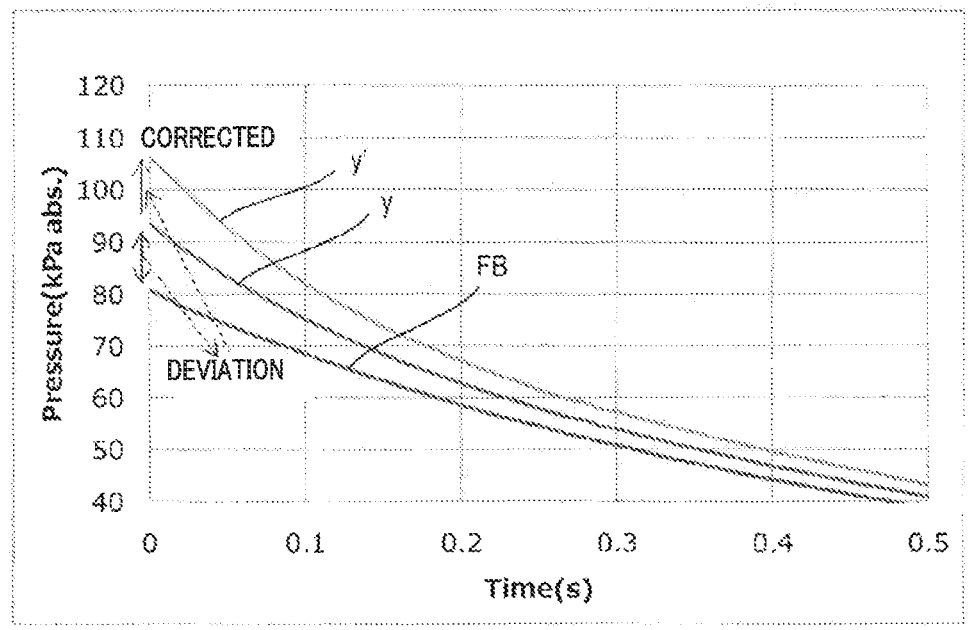
FIG. 10 is a graph for explaining the correction of the control command value.

As illustrated in FIG. 10, in the present embodiment, a deviation between the control command value y and the present pressure value FB is obtained in real time, and the corrected control command value y' is generated by adding this deviation to the control command value y. In the illustrated embodiment, since the actual pressure value FB is smaller than the control command value y, a corrected control command value y' exceeding the control command value y is generated. This state corresponds to, for example, a state in which the initial pressure is smaller than the reference initial pressure, and therefore the valve opening degree needs to be made smaller in order to match the reference pressure drop curve.

According to the control command value y' (sometimes referred to as the corrected command value y') corrected in this way, in the PID control, the driving voltage of the piezoelectric actuator is greatly reduced, and the operation of reducing the valve opening degree is performed more quickly. This makes it possible to adjust the pressure faster to match the reference pressure drop curve.

Figure 11:
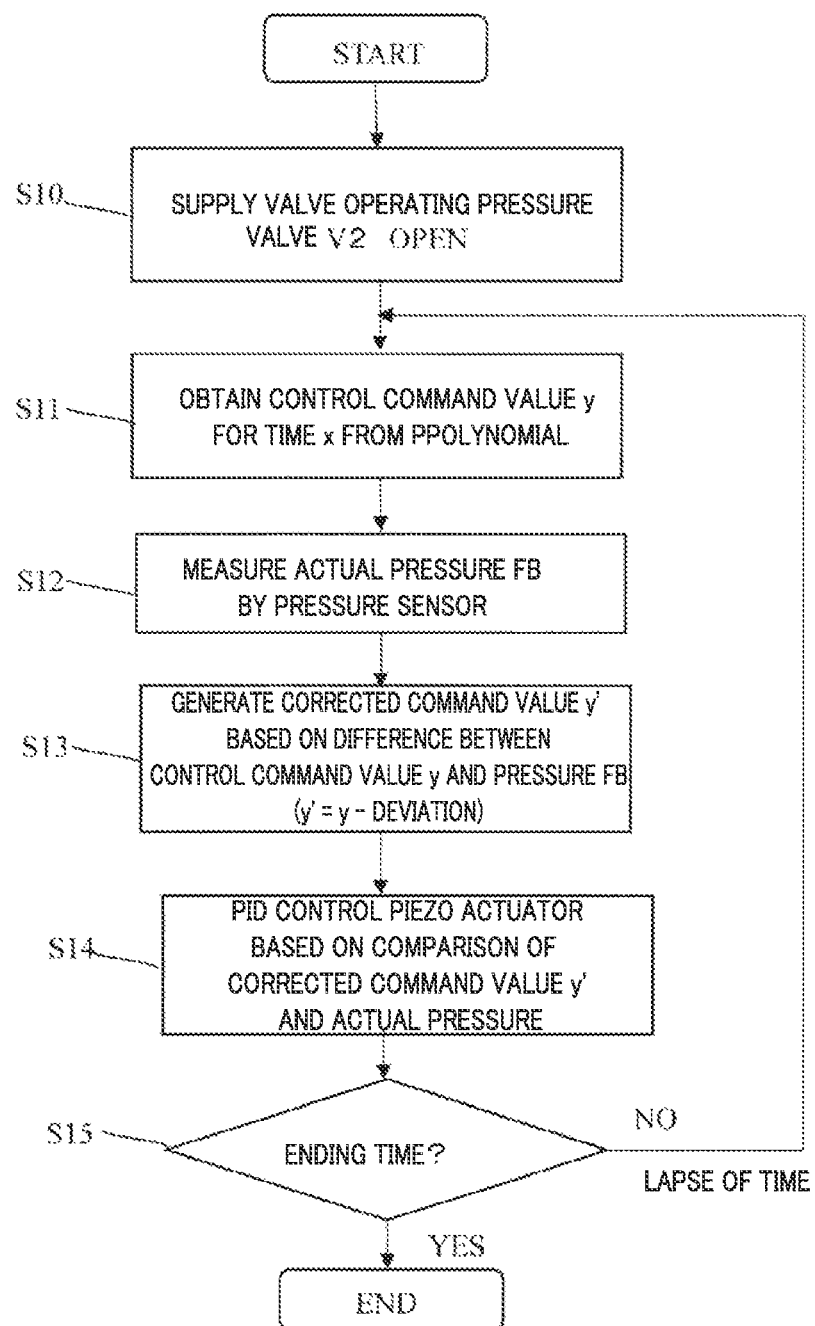
FIG. 11 is a flowchart illustrating a procedure for controlling the driving voltage of the piezo actuator based on the reference pressure drop curve according to another embodiment.

FIG. 11 illustrates an exemplary flow chart for adjusting the opening degree of the valve device V2 in accordance with the reference pressure drop curve in the present embodiment.

First, same as the flow chart shown in FIG. 7, the valve device V2 is opened in step S10 from the state where the gas is stored in the tank, the control command value y is calculated by using the polynomial (approximate expression of the reference pressure drop curve) in step S11, and the present actual pressure value measured by using the pressure sensor is obtained in step S12.

Next, in the present embodiment, an operation of correcting the control command y is performed as shown in step S13. This operation is performed by obtaining a deviation (FB-y) between the current pressure value FB obtained in step S12 and the control command value y obtained in step S11, and subtracting this deviation from the control command value y.

Here, when the current pressure value FB is smaller than the control command value y, the deviation (FB-y) takes a negative value, so that the corrected control command value y' is larger than the control command value y by only the deviation. On the other hand, when the present pressure value FB is larger than the control command value y, the deviation (FB-y) takes a positive value, so that the corrected control command value y' is smaller than the control command value y by only the deviation.

Thereafter, as shown in step S14, the PID control of the piezo actuator is performed based on the corrected command value y' (and the current pressure value FB). As a result, it is possible to adjust to the control command value y more quickly than that in the case of using the control command value y before correction. This operation is continued until the ending time is confirmed in step S15.

Figure 12:
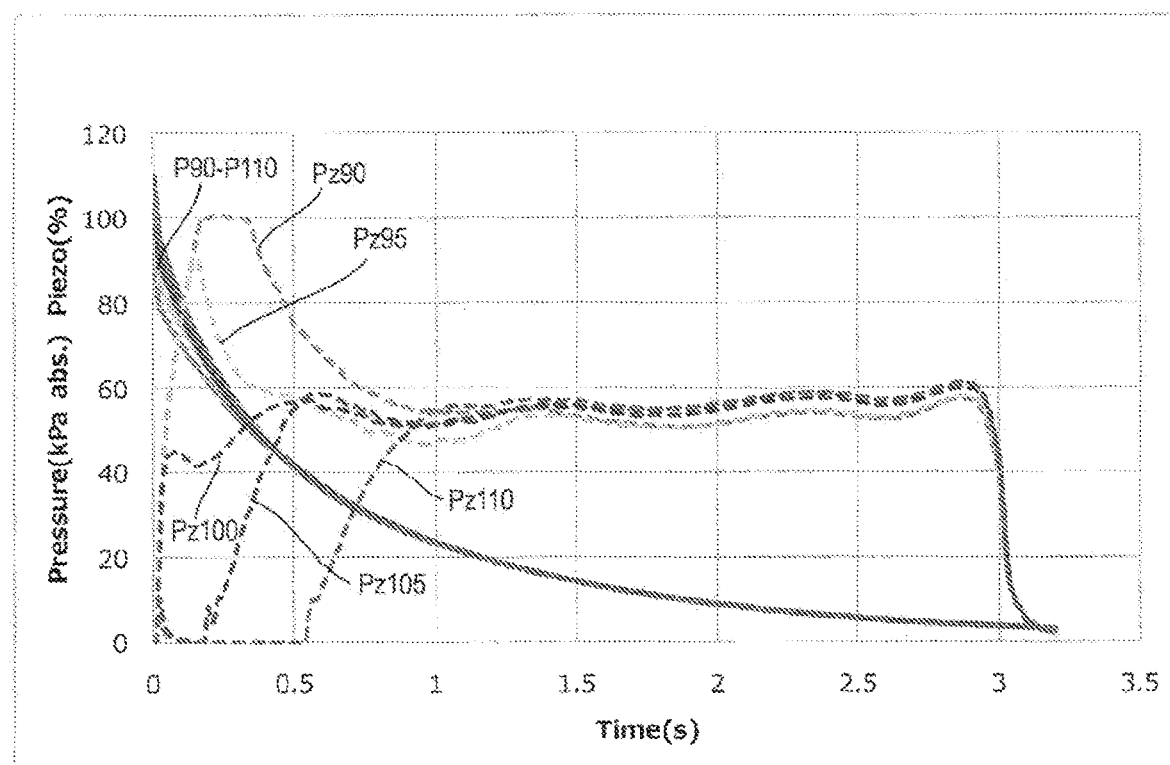
FIG. 12 is a graph illustrating pressure drop and changes in piezo driving voltage according to the valve operation control based on the pressure measurement of another embodiment of the present invention.

FIG. 12 is a graph illustrating a pressure drop (solid line) and piezo drive voltages (dashed line) as a result of performing valve operation control according to another embodiment of the present invention. The reference initial pressure is set as 100 kPa, the graph indicates the cases where the initial pressures are larger than it and the cases where the initial pressure are smaller than it.

As shown in FIG. 12, in the present embodiment, it can be seen that the operation of quickly adjusting to the reference pressure drop curve is realized as compared with the case of the embodiment shown in FIG. 9.

While embodiments of the present invention have been described above, various modifications are possible. For example, although an embodiment of using a piezo actuator as the sub actuator has been described above, the present invention is not limited thereto, and an actuator including a deformable material by electrical driving such as an electrically driven polymer material or an electroactive polymer material may be used. Note that the electrical driving includes applying a voltage to the element, supplying a current to the element, or forming an electric field around the element. Instead of the piezo actuator, an actuator including a solenoid utilizing a magnetic force may also be used.

Although a normally closed valve device has been described above, the valve device may be a normally open valve device. In addition, by adopting a structure in which an extension (an isolation member, not shown) can be inserted between the lower end portion of the piezoelectric element and the diaphragm pusher, the piezoelectric element can be prevented from being affected by temperature (high temperature or low temperature).

Although the aspect of using the valve device V2 combining a fluid drive valve and a piezo actuator has been described above, the fluid control device may be configured by using a common valve having an adjustable opening degree such as a piezo valve.

INDUSTRIAL APPLICABILITY

The fluid control device, the fluid supply system, and the fluid supply method according to the embodiments of the present invention are preferably used in semiconductor manufacturing, for example.

REFERENCE SIGNS LIST

2 Gas supply source
4 Tank
6 Process chamber
8 Vacuum pump
10 Fluid control device
12 Control circuit
20 Valve mechanism
22 Main actuator
24 Sub actuator
26 Opening/closing detection device
100 Fluid supply system
PT Pressure sensor
T Temperature sensor
V1 Upstream on-off valve
V2 Valve device

The invention claimed is:
1. A fluid control device comprising:
a valve device configured to open/close a flow path and adjust a flow rate of a fluid flowing through the flow path,
a pressure sensor provided upstream of the valve device; and
a control circuit connected to the valve device and the pressure sensor;
wherein the valve device includes a main valve having a main actuator operated by a driving fluid and a corresponding valve element, and a sub valve having a sub actuator extendable by an electrical drive and a corresponding valve element,
branch flow paths are formed downstream of the pressure sensor, the main valve being provided at one of the branch flow paths and the sub valve being provided at another one of the branch flow paths, and
the control circuit controls an operation of the sub actuator of the sub valve based on a pressure measured by the pressure sensor and a reference pressure drop curve, in a state where an upstream side of the fluid control device is closed and the main valve is opened by using the main actuator.

2. The fluid control device according to claim 1, further comprising an opening/closing detection device for determining an opening/closing of the main valve or the sub valve.

3. The fluid control device according to claim 2, wherein the opening/closing detection device includes a limit switch.

4. The fluid control device according to claim 2, wherein the opening/closing detection device detects an opening/closing of the valve element by a change in a voltage applied to the sub actuator of the sub valve.

5. The fluid control device according to claim 1, wherein the control circuit is configured to obtain the reference pressure drop curve by measurement using the pressure sensor when a reference flow is occurring, while an approximate polynomial based on the reference pressure drop curve is obtained, an operation of the sub actuator of the sub valve is controlled on the basis of a difference between a pressure value at a predetermined time according to the obtained approximate polynomial and a pressure value measured by the pressure sensor at the predetermined time.

6. The fluid control device according to claim 5, wherein the control circuit is configured so as to correct a control command value of the sub actuator of the sub valve based on the reference pressure drop curve in accordance with a difference between the pressure value at the predetermined time according to the approximate polynomial and the pressure value measured by the pressure sensor at the predetermined time, and to control the operation of the sub actuator based on the corrected control command value.

7. A fluid supply system comprising:
a fluid supply source;
an upstream on-off valve provided downstream of the fluid supply source;
a tank provided downstream of the upstream on-off valve; and
a fluid control device according to claim 1, provided downstream of the tank.

8. The fluid supply system according to claim 7, wherein the control circuit of the fluid control device controls an operation of the sub actuator of the sub valve based on the reference pressure drop curve when a gas stored in the tank is supplied via the fluid control device, in a state where the upstream on-off valve is closed.

9. A fluid supply method using the fluid supply system of claim 7, comprising:
a step of storing a gas from the fluid supply source in the tank, in a state where the upstream on-off valve is opened, and the main valve and the sub valve of the fluid control device is closed;

a step of closing the upstream on-off valve after the gas is stored; and a step of supplying the gas stored in the tank by opening the main valve of the fluid control device after closing the upstream opening/closing valve, wherein the step of supplying the gas stored in the tank includes a step of controlling an operation of the sub actuator of the sub valve based on the pressure measured by the pressure sensor and the reference pressure drop curve.

10. The fluid supply method according to claim 9, comprising:

a step of closing the main valve and the sub valve of the fluid control device after the step of supplying the gas to end a first process; and a step of opening the upstream on/off valve after closing the main valve and the sub valve of the fluid control device to store the gas in the tank, and then closing the upstream on/off valve and opening the main valve of the fluid control device to perform gas supply in a consequent second process, wherein the reference pressure drop curve is obtained by using the pressure center when supplying the gas in the first process, and in the process subsequent to the first process, the operation of the sub actuator of the sub valve is controlled by using the reference pressure drop curve obtained in the first process.

* * * * *